United States Patent
Johnson et al.

(10) Patent No.: US 7,715,931 B2
(45) Date of Patent: May 11, 2010

(54) SOCKET ALIGNMENT MECHANISM AND METHOD OF USING SAME

(75) Inventors: John C. Johnson, Phoenix, AZ (US); Wei-ming Chi, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 512 days.

(21) Appl. No.: 11/716,255

(22) Filed: Mar. 9, 2007

(65) Prior Publication Data

US 2008/0221712 A1 Sep. 11, 2008

(51) Int. Cl.
*G05B 19/18* (2006.01)
*G06F 19/00* (2006.01)
*G05D 1/10* (2006.01)
*G06K 9/00* (2006.01)
*H04N 7/18* (2006.01)

(52) U.S. Cl. .............................. 700/57; 700/58; 700/59; 700/60; 700/64; 700/66; 700/114; 700/121; 700/302; 382/151; 348/95

(58) Field of Classification Search ............. 700/56–62, 700/64, 66, 114–116, 121, 302; 702/117; 382/145, 146, 147, 151; 257/797; 438/14–18; 324/758; 348/87, 94, 95
See application file for complete search history.

(56) References Cited

U.S. PATENT DOCUMENTS

| 6,262,581 | B1 | 7/2001 | Han |
| 6,292,003 | B1 * | 9/2001 | Fredrickson et al. ........ 324/754 |
| 6,458,609 | B1 * | 10/2002 | Hikita et al. .................. 438/15 |
| 6,535,004 | B2 | 3/2003 | Mehta et al. |
| 7,254,889 | B1 | 8/2007 | Cherian |
| 2004/0256463 | A1 * | 12/2004 | Kudo ..................... 235/462.11 |

* cited by examiner

*Primary Examiner*—Sean P Shechtman
(74) *Attorney, Agent, or Firm*—Blakely, Sokoloff, Taylor & Zafman LLP

(57) ABSTRACT

An alignment mechanism to align a microelectronic device to a socket, the device including an array of contact pads thereon. The mechanism includes a socket system having a socket and a device positioning mechanism disposed adjacent the socket and adapted to position the device in the socket. The mechanism also includes a control system adapted to receive alignment data on a position of the array of contact pads relative to two reference sides of the device, the control system further being adapted to control the device positioning mechanism as a function of alignment data to align the device in the socket.

13 Claims, 4 Drawing Sheets

SOCKET ALIGNMENT MECHANISM AND METHOD OF USING SAME

FIELD

Embodiments of the present invention relate generally to the field of microelectronic device socketing. More specifically, embodiments of the present invention relate to mechanisms for socketing microelectronic devices including an active alignment of such devices.

BACKGROUND

The prior art offers a number of methods for aligning microelectronic devices (hereinafter "devices") to sockets, such as, for example, test sockets.

As shown in FIG. 1, according to a passive alignment method, a microelectronic device in the form of a package 100 is passively aligned with guide walls 102 on a socket 104. Such a passive alignment method relies on the clearance between socket guide walls 102 and edges 106 of package 100 in order to effect the alignment of contact pads 108 on the package 100 to contact pins 109 of the socket 104. However, disadvantageously, a reliance on the clearance mentioned above, in addition to a reliance on a control of manufacturing variations inherent in the dimensions of guide walls 102 and device edges 106 negatively impacts the alignment accuracy between contact pads 108 on the package 100 and contact pins 109 of the socket 104. In addition, disadvantageously, because of significant positional variations of contact pad arrays from device to device, the passive alignment method is not applicable to device contact pads smaller than about 12 mils.

Another known socket alignment method, such as shown for example in FIGS. 2a and 2b, uses a non-calibrated active alignment process to align package 200 to a socket 204. According to such a method, an alignment mechanism includes spring-loaded socket guides 202 (FIG. 2a) to push package 200 against socket datum 204 (FIG. 2b), and this in order to eliminate package positioning errors arising from the clearance gap between package edges and the socket walls, as described above with respect to FIG. 1. The above enhances alignment accuracy to about 10 mils, but is still largely inapplicable to the alignment of devices having contact pads smaller than about 10 mils.

Vision-based active alignment systems further exist as part of test handling equipments in order to allow a more precise alignment of a device to a corresponding socket. As seen in FIGS. 3a and 3b, a vision-based active alignment system 300 for each socket contactor or socket 310 includes a handling chuck 312 that is adapted to hold and move a device in the form of a package 314, the package having an array of contact pads 316 thereon. A camera 318 of the test handling equipment shown is positioned to acquire data in the form of an image of the array of contact pads 316 on the package 314. A control system 320 is then used to determine a positioning error between the array of contact pads 316 and the known position of an array of contact test pins 322 on the socket 310. The position of the array of contact test pins 322 may also be determined via camera imaging. The control system 320 then moves the handling chuck 312 as a function of the determined positioning error in order to align the array of contact pads 316 to the corresponding array of test contact pins 322 on the socket 310.

However, mechanical, calibration and other tolerances in the use of the above system disadvantageously limit positional accuracy to about 40 microns. The above leads to a socketing alignment accuracy of about 7 to about 8 mils.

The prior art fails to provide an alignment mechanism and method adapted to allow the alignment of a microelectronic device having contact pads measuring less than 7 mils, such as contact pads measuring about 5 mils.

BRIEF DESCRIPTION OF THE DRAWINGS

FIG. 5b is a top plan view of the alignment system of FIG. 5a.

Figure 1:
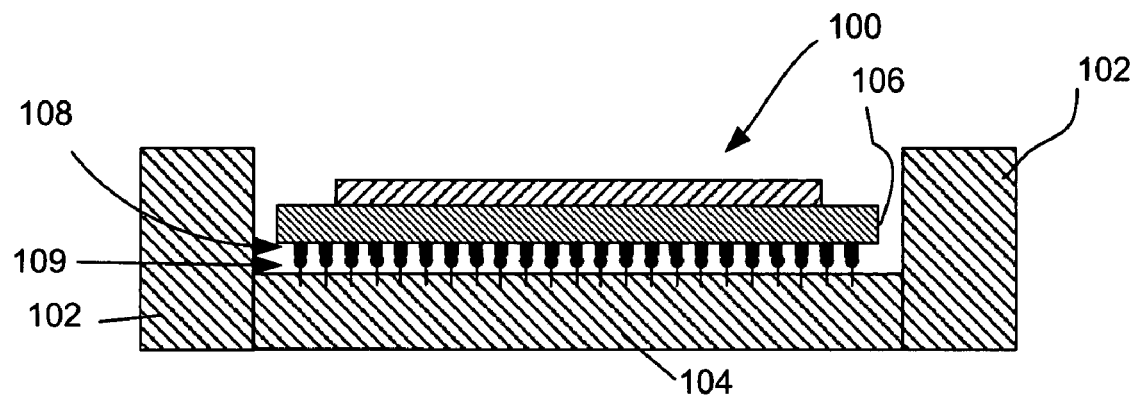
FIG. 1 is a schematic cross-sectional view of a prior art socket using a passive alignment method.
Figure 2A:
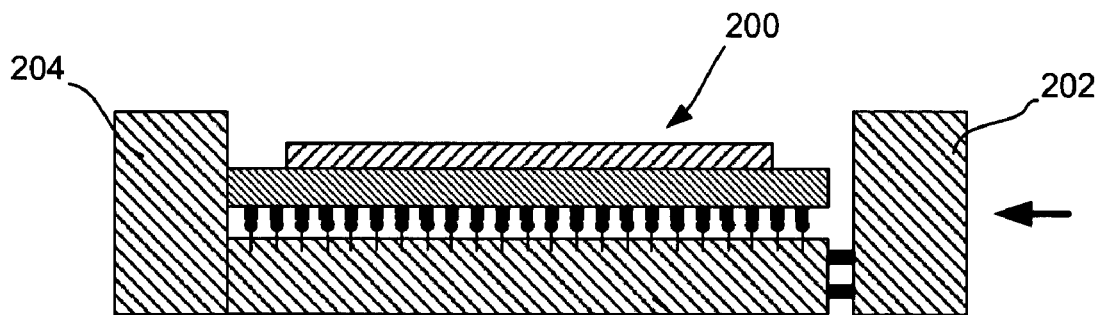
FIGS. 2a and 2b are schematic cross-sectional views of a prior art socket in two stages of an active alignment method.
Figure 2B:
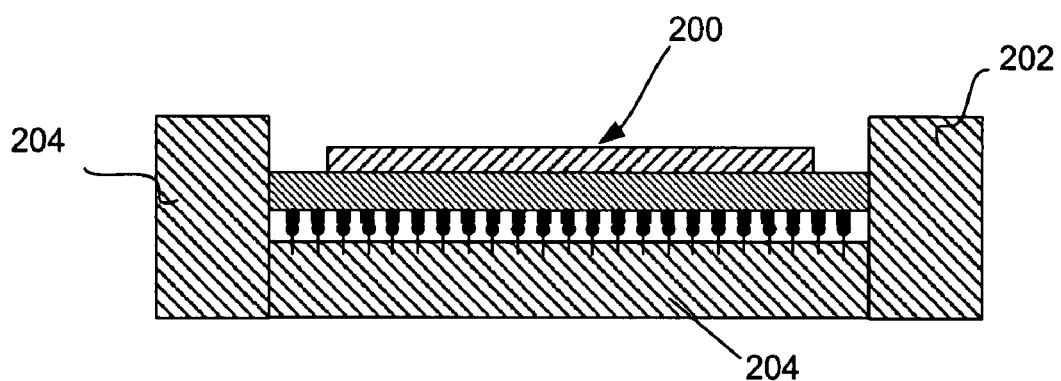

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an alignment mechanism and a method of aligning a microelectronic device in a socket are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B.

Aspects of this and other embodiments will be discussed herein with respect to FIGS. 4, 5a and 5b below. The figure, however, should not be taken to be limiting, as it is intended for the purpose of explanation and understanding.

Figure 3A:
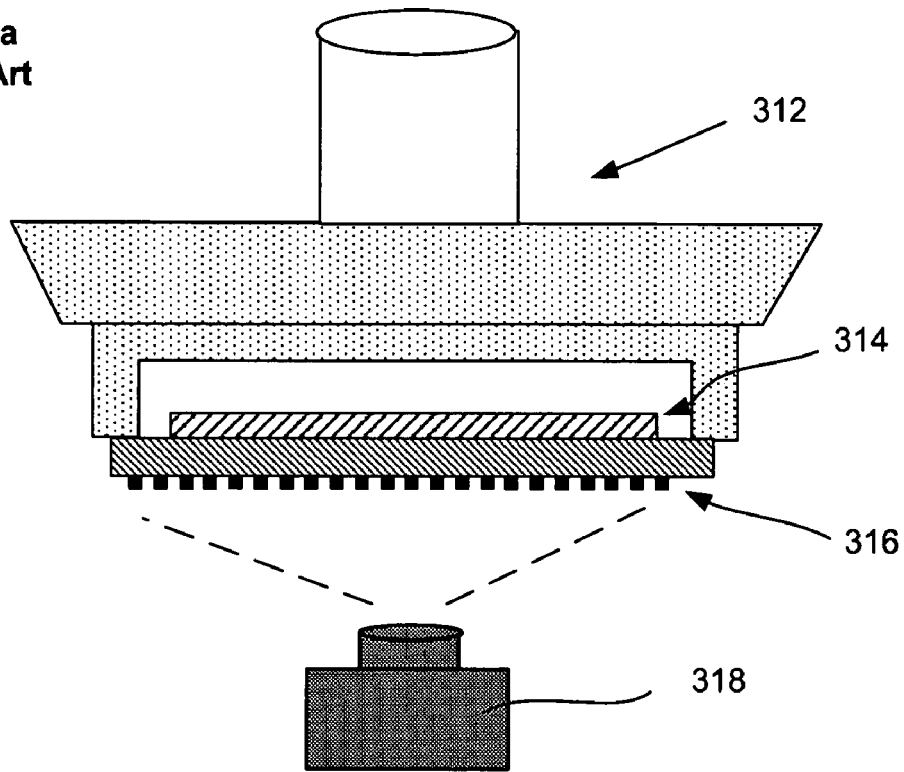
FIGS. 3a and 3b are schematic partially cross-sectional views of stages in a vision-based prior art active alignment method.
Figure 3B:
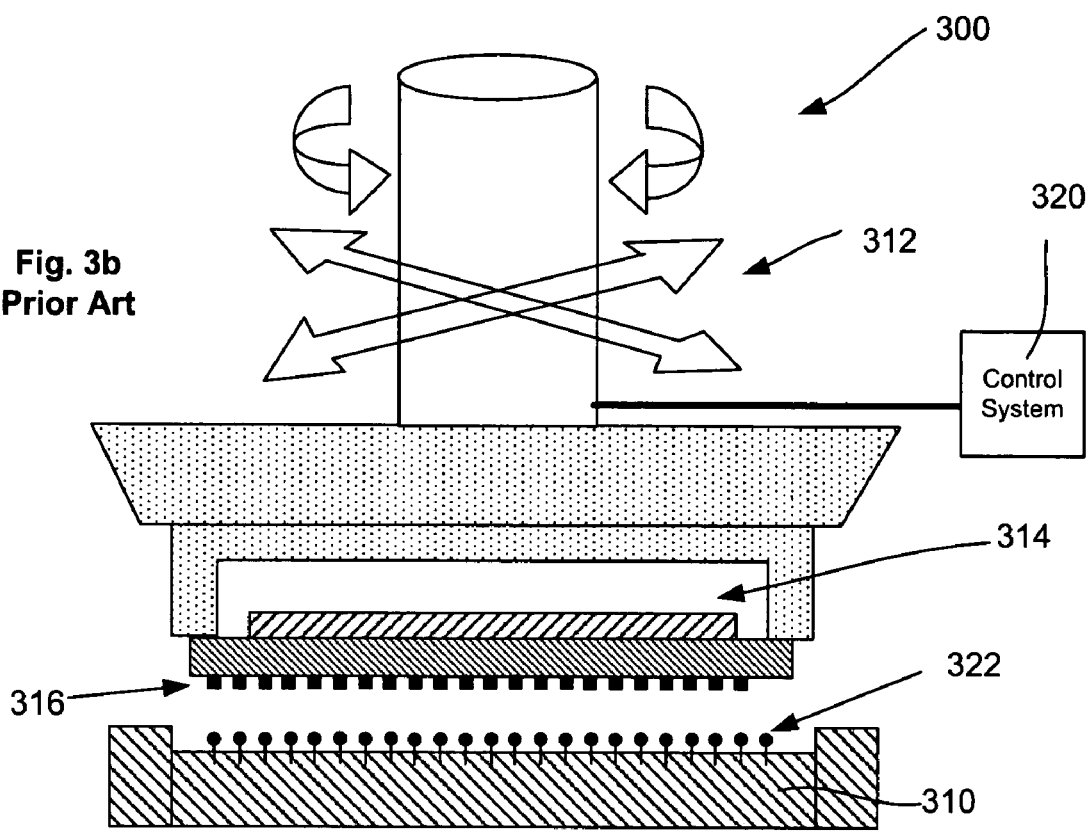
Figure 4:
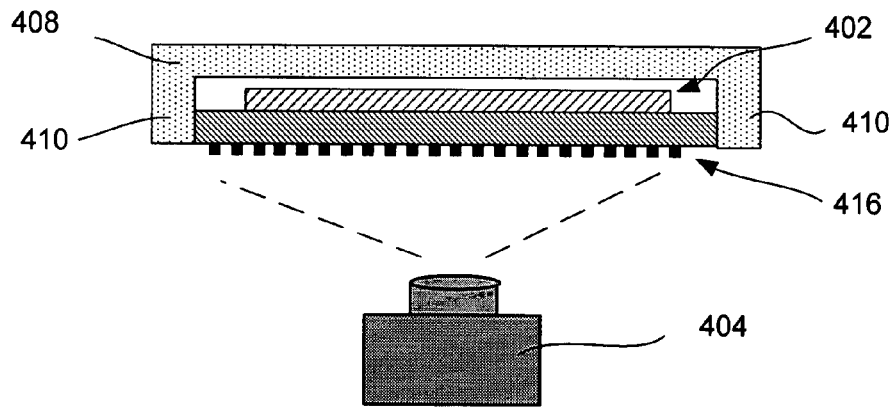
FIG. 4 is a schematic partially cross-sectional view of an vision-based active alignment stage according to one embodiment.

FIG. 4 shows one embodiment of a mechanism for obtaining alignment data on a device, such as a package 402. The mechanism may include, for example, an imaging system such as a camera 404, the camera being adapted to acquire alignment data on the package 402. By "alignment data," what is meant in the context of embodiments is data including a position of the array of contact pads on a device relative to at least two reference sides of the device. The alignment data according to embodiments may include the actual device X-Y sizes and device pad array true positions. Thus, camera 404 is adapted to acquire an image including data on a position of array 416 of contact pads on package or device 402 relative to two reference sides of the device. It is noted that prior art vision-based alignment systems, such as for example that shown in FIGS. 3a and 3b, do not store the positional data of the array of contact pads relative to two reference sides of the device, but simply an image of the array without reference to any other positions on the device. By recording a position of the array of contact pads using reference sides of the device, embodiments advantageously eliminate many of the positioning errors of the prior art, as will be explained further below. Optionally, as shown in FIG. 4, in order to obtain the alignment data, the package or device 402 may be placed in a fixture 408 as shown with walls 410 that touch the device reference sides in the same manner as those that will be used in the socket. According to this embodiment, the camera 404 would not need to actually resolve an accurate image of the edge of the device 402, which may sometimes be difficult to achieve, as it would be difficult to define an absolute reference edge. Thus, where, according to the latter option, the device edges are held the same way both for imaging and for alignment purposes, any edge image resolution issues are substantially eliminated. According to embodiments, the mechanism for obtaining alignment data may be part of an alignment mechanism 500 (see FIGS. 5a and 5b) adapted to align a device in a socket, or, in the alternative, it may be separate from such alignment mechanism. In the latter case, alignment data on a given device may be stored according to an embodiment, such as, for example, in the form of an ID tag (see FIGS. 5a and 5b) on each device prior to its insertion into a handling chuck of an alignment mechanism. Although FIG. 4 shows an imaging system as acquiring the alignment data according to one embodiment, embodiments are not so limited, and can include alignment data as defined herein obtained in any manner within the knowledge of a person skilled in the art.

Figure 5A:
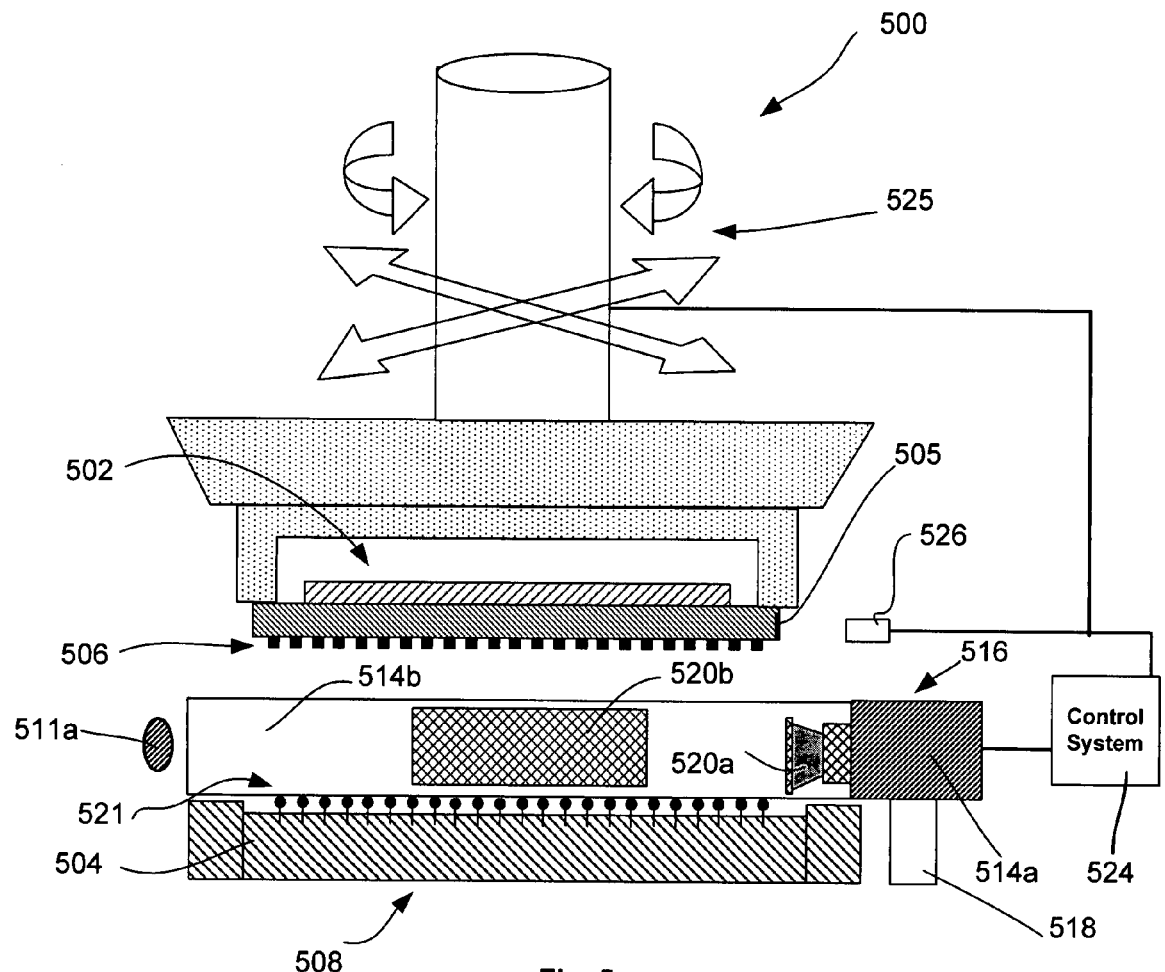
FIG. 5a is a schematic partially cross-sectional view of a socket alignment system according to an embodiment.
Figure 5B:
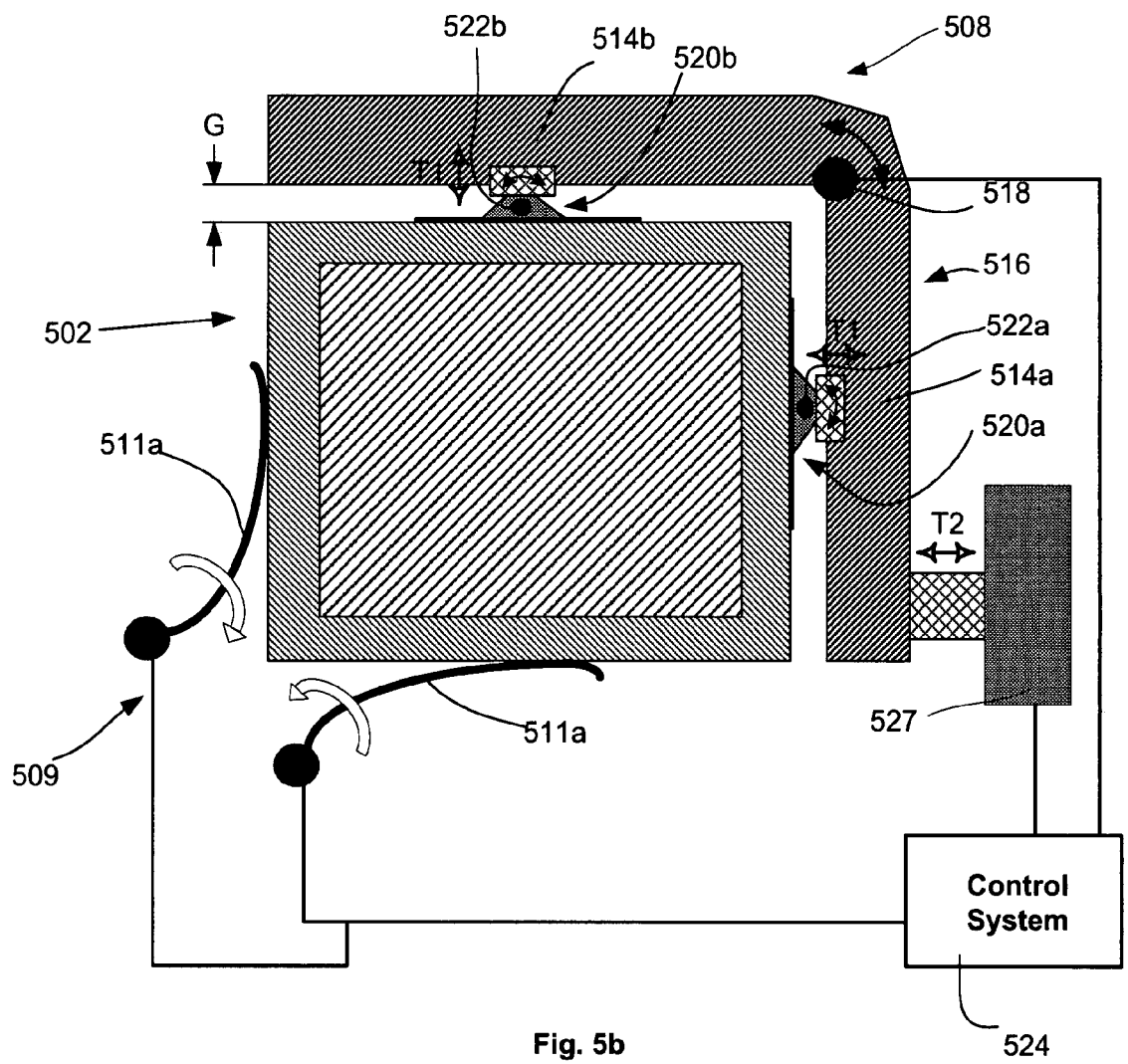

Reference is therefore made to FIGS. 5a and 5b, which shows an alignment mechanism 500 adapted to align a microelectronic device 502 to a socket 504. As shown the device 502 includes an array 506 of contact pads thereon, and may, as described in the above paragraph, include an ID tag 505 thereon storing alignment data on the device 502. The alignment data may, for example, be obtained by placing the device 502 before a camera such as camera 404 of FIG. 4. The mechanism 500 has: a socket system 508, and a control system 524, as will be described in further detail below.

The socket system 508 includes a socket 504, into which the device 502 is either in the process of being positioned, as shown in FIG. 5a, or shown as having been positioned and aligned, as shown in FIG. 5b. The socket 504, may, for example, have a conventional test socket configuration, such as one used, for example, for package final testing, burn-in testing, system-level testing, or hand-socketing. The device positioning mechanism may, in one embodiment, as in the case of the shown embodiment, include datum structure 516, which in turn may include datum guide walls 514a and 514b, and, optionally, adjusting actuators 520a and 520b. The device positioning mechanism may further include, according to the shown embodiment, a pusher mechanism 509 including a pair of pusher arms 511a and 511b. Preferably, as shown, the guide walls 514a and 514b are part of the same datum structure 516, which is actuatable by being rotated about hinge 518 as its axis of rotation. In the shown embodiment, the datum structure 516 may further include respective adjusting actuators 520a and 520b attached to guide walls 514a and 514b. A role of the adjusting actuators is to define a gap G between each guide wall and an insertion position of the device (FIG. 5b). By "insertion position of the device,"
what is meant is the position of the device 502 in the socket system 508 after positioning and alignment of the same in the socket 504, that is, a position of the device 502 such that array 506 of contact pads of the device 502 are aligned with respective contact elements, such as contact pins 521 of the socket system 508. Preferably, each adjusting actuator 520a and 520b is translatable with respect to its respective datum guide wall 514a and 514b as shown by arrows T1, and further rotatable about respective axes of rotation 522a and 522b as shown, in order to facilitate an alignment of the device 502 within the socket 504. The datum structure 516 may itself by translatable with respect to a housing 527 of the socket 504 as suggested by arrow T2. In turn, the pair of pusher arms 511a and 511b, which may be used to push the device 502 into alignment within socket 504 against the adjusting actuators 520a and 520b of the datum structure 516.

The control system 524 is adapted to receive alignment data concerning the device 502, such as, for example, by way of an ID reader 526 coupled thereto, the ID reader 526 being adapted to read alignment data from an ID tag 505 on the device, and to transmit such data to the control system 524. The control system 524 is further shown as being coupled to the device positioning mechanism, which, in the shown embodiment, include both the handling chuck 525 and the datum structure 516 (including guide walls 514a and 514b, and adjusting actuators 520a and 520b), and, in addition, the pusher mechanism 509 including pusher arms 511a and 511b. According to embodiments, the control system 524 controls the device positioning mechanism (either the chuck 525 or the datum structure 516 or both) as a function of the alignment data in order to align the device 502 in the socket 504. Thus, for example, the control system could rotate the chuck and/or translate the same in a manner to ensure alignment with the contact pins 521 of the socket 504 as a function of the alignment data and as a function of information available regarding the positioning of the contact pins 521 of the socket 504. In addition, or in the alternative, the control system 524 may be used to adjust a position of the datum structure 516 before the device 502 is placed in the socket 504. Optionally, pusher arms 511a and 511b may be controlled by the control system 524 to push the device 502 into alignment against the datum structure 516 as a function of the alignment data. Preferably, the control system 524 controls only the device positioning mechanism without control of the chuck 525, in which case the chuck is preferably a floating chuck capable of translation and rotation but independently of the control system 524 in order to bring the device 502 above the socket 504, and to place the device on socket base 505 as guided by socket guiding walls 507 as shown in FIG. 5a. In that case, preferably, the control system 524 would have already controlled the datum structure 516 into position corresponding to a desired position of the device 502 in the socket 504 based on the alignment data. After positioning of the device 502 onto the socket base 505, the control system 524 could then be used to push the device 502 into alignment against the datum structure 516, and, thereafter, the chuck could be used to press down on device 502 to create electrical coupling between array of contacts 506 of the device 502 and pins 521 of the socket 504.

In operation, according to one embodiment, device 502 may be presented to imaging system 404 as shown in FIG. 3, and alignment data concerning the device 502 may be acquired by the imaging system 404. The image may be processed to locate the array of contact pads' true position relative to at least two reference sides of the device 502. The acquisition of the alignment data, be it via an image system or otherwise, may according to embodiments be effected directly within the alignment mechanism 500, or, in the alternative, in a prior manufacturing step, in which case it could be assigned to an unit level ID, such as ID tag 505 and/or placed in a manufacturing database for later use by the alignment mechanism 500.

Prior to insertion of the device 502 into the socket 504, the alignment data may be sent to the control system 524 that manages the socket micro-actuators, in the form of, for example, the chuck 525 and/or the datum structure 516 including guide walls 514a and 514b, adjusting actuators 520a and 520b, and pusher mechanism 509. The control system 524 may then use the alignment data to align the guide walls 514a and 514b before the device arrives for insertion into the contactor array. In the alternative, the chuck 525 may further be rotated or translated by the control system 524 in order to ensure further alignment of device 502 within socket 504. The control system 524 may then actuate the pusher mechanism 509 to press the package into alignment against the datum guide walls 514a and 514b. Preferably, an embodiment involves the control of only the guide structure and pusher mechanism to align the device, as opposed to a control of the chuck.

Advantageously, embodiments provide a self-registering device alignment system that allows alignment accuracy down to at least 5 mils, thus making the alignment mechanism of embodiments suitable for next generation microelectronic devices. In addition, advantageously, embodiments contemplate alignment data which takes into consideration the true position of the array of contact pads on a device relative to at least two reference sides of the device, in this way minimizing many of the errors associated with the prior art. Additionally, embodiments do not rely on vision capture capability within the package handler, or alignment mechanism. Advantageously, alignment data according to embodiments may be obtained earlier and the data used multiple times for subsequent calibrated active socketing requirements. In addition, advantageously, embodiments allow individual device dimension errors to be accounted for and corrected directly, in this way reducing a stack-up of multiple tolerances and allowing higher alignment accuracies than those afforded by the prior art. Where datum guide walls are used along with adjusting actuators, a gap may be advantageously provided that is sufficiently wide to present device jamming during insertion into the socket. The gap would need to be closed only during device alignment within the socket. To prevent device jamming during either insertion into the socket or removal from the socket, either the actuators 520a/520b may be retracted, or the pusher mechanism 509 may be held open. By actively creating a clearance gap and then closing the same, a substantially accurate alignment may advantageously be obtained without device jamming. In addition, advantageously, since a preferred embodiment involves control of the datum structure 516 and, optionally, of the pusher mechanism 509 instead of the chuck 525, and, further, since, according to embodiments, acquisition of the alignment data is not predicated on the presence of a vision system that is a part of the alignment mechanism itself, an embodiment allow the provision of an alignment mechanism that is much less complicated than package handlers of the prior art.

In the prior art, socket alignment mechanisms being currently used will not be able to lead to an alignment requirement for solder resist opening (SRO) sizes of 12 mils or less unless the package tolerance can be improved by 50%, which can disadvantageously significantly increase substrate manufacturing costs. On the other hand, according to embodiments, vision alignment accuracy can reach from about 30 to about 40 microns, and the socket capability for SRO openings can reach below 10 mils while maintaining a failure rate of about 0.1% or less for both pin and socket levels.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. An alignment mechanism to align a microelectronic device to a socket, the device including an array of contact pads thereon, the mechanism comprising:
   a socket system including:
   a socket; and
   a device positioning mechanism disposed adjacent the socket and adapted to position the device in the socket;
   a control system adapted to receive alignment data on a position of the array of contact pads relative to two reference sides of the device, the control system further being adapted to control the device positioning mechanism as a function of alignment data to align the device in the socket; and
   wherein the device positioning mechanism includes datum guide walls, and wherein the control system is adapted to adjust a position of the datum guide walls as a function of the alignment data to align the device in the socket.

2. The alignment mechanism of claim 1, wherein the device positioning mechanism includes a handling chuck adapted to pick up a device and to place the device inside the socket, and wherein the control system is adapted to control the handling chuck as a function of the alignment data to align the device in the socket.

3. The mechanism of claim 1, further comprising an imaging system adapted to acquire the alignment data, the imaging system being coupled to the control system to transmit the alignment data thereto.

4. The mechanism of claim 1, further comprising an ID reader adapted to read the alignment data, the ID reader being coupled to the control system to transmit the alignment data thereto.

5. The mechanism of claim 1, wherein the control system is adapted to adjust a position of the guide walls before the device is placed in the socket.

6. The mechanism of claim 1, wherein the socket system further includes a pusher mechanism adjacent the socket and adapted to press the device into alignment against the guide walls.

7. The mechanism of claim 1, wherein the socket mechanism defines a gap between the guide walls and an insertion position of the device.

8. A method of positioning a microelectronic device into a socket of a socket system, the device having an array of contact pads, the socket system including a socket and a device positioning mechanism adjacent the socket, the method comprising:
   inputting alignment data regarding a position of the array of contact pads relative to two reference sides of the device into a control system coupled to the device positioning mechanism;
   using the control system to control the device positioning mechanism as a function of alignment data to align the device in the socket; and
   wherein the device positioning mechanism includes datum guide walls, and wherein controlling comprises adjusting a position of the datum guide walls as a function of the alignment data to align the device in the socket.

9. The method of claim 8, wherein the device positioning mechanism includes a handling chuck adapted to pick up a device and to place the device inside the socket, and wherein controlling comprises controlling the handling chuck as a function of the alignment data to align the device in the socket.

10. The method of claim 8, further comprising using an imaging system to acquire the alignment data, the imaging system being coupled to the control system to transmit the alignment data thereto.

11. The method of claim 8, further comprising using an ID reader to read the alignment data, the ID reader being coupled to the control system to transmit the alignment data thereto.

12. The mechanism method of claim 8, wherein controlling comprises adjusting a position of the guide walls before the device is placed in the socket.

13. The mechanism method of claim 8, further comprising pressing the device into alignment against the guide walls.

* * * * *